United States Patent
Park et al.

(10) Patent No.: US 7,797,781 B2
(45) Date of Patent: Sep. 21, 2010

(54) ROBOT MECHANISM FOR CLEANING AND INSPECTION OF LIVE-LINE INSULATORS

(75) Inventors: Joon Young Park, Daejeon (KR); Sung Il Song, Daejeon (KR); Byung Hak Cho, Daejeon (KR); Seung Hyun Byun, Daejeon (KR); Jin Bong Kim, Busan (KR)

(73) Assignee: Korea Electric Power Corporation, Seoul (KR)

( * ) Notice: Subject to any disclaimer, the term of this patent is extended or adjusted under 35 U.S.C. 154(b) by 710 days.

(21) Appl. No.: 11/811,899

(22) Filed: Jun. 11, 2007

(65) Prior Publication Data

US 2008/0301891 A1    Dec. 11, 2008

(51) Int. Cl.
*H01B 17/52* (2006.01)
*B08B 1/04* (2006.01)

(52) U.S. Cl. .................. 15/88.4; 15/21.1; 15/246
(58) Field of Classification Search .......... 15/21.1, 15/88.4, 246; 174/137 R, 142
See application file for complete search history.

(56) References Cited

U.S. PATENT DOCUMENTS

| 1,568,408 | A | * | 1/1926 | Miles et al. ............... 15/28 |
| 5,041,164 | A |   | 8/1991 | Hingorani |
| 5,119,851 | A |   | 6/1992 | Paris |
| 5,201,090 | A | * | 4/1993 | Jans ........................ 15/88.4 |
| 7,200,889 | B2 | * | 4/2007 | Vohra ....................... 15/88.2 |

FOREIGN PATENT DOCUMENTS

| DE | 3508769 | * | 9/1986 |
| JP | 1-176613 |   | 7/1989 |
| JP | 3-77214 |   | 4/1991 |
| JP | 4-17224 |   | 1/1992 |
| JP | 4-243586 | * | 8/1992 |
| JP | 5-282948 | * | 10/1993 |
| JP | 5-282949 | * | 10/1993 |
| JP | 5-282950 | * | 10/1993 |
| JP | 7-45147 |   | 2/1995 |
| JP | 8-106829 |   | 4/1996 |
| JP | 2001-210161 | * | 8/2001 |
| JP | 2003-151389 | * | 5/2003 |
| JP | 2003-217374 |   | 7/2003 |
| KR | 10-0285530 |   | 4/2001 |
| KR | 10-0433752 |   | 6/2004 |
| KR | 10-0691616 |   | 3/2007 |

* cited by examiner

*Primary Examiner*—Mark Spisich
(74) *Attorney, Agent, or Firm*—Kenyon & Kenyon LLP

(57) ABSTRACT

A robot mechanism adopts a dry cleaning method to clean the surface of live-line insulators without using water and can perform cleaning and inspection of the surface of the live-line insulators while automatically moving along an insulator string. The robot mechanism includes a main unit having upper and lower wing frames connected with each other by a connecting bracket to surround the insulator string, a cleaning unit disposed between the upper and lower wing frames and including a base frame to perform dry cleaning with a rotational brush and a CM guide, a lift unit including a clamp and a ball-bearing screw to move the main unit up or down, and an inspection unit to electrically inspect the insulators; and a coupling unit to couple a pair of the main units to allow the pair of main units to move along a tension insulator string or a suspension insulator string.

10 Claims, 20 Drawing Sheets

(a)

(b)

(a)

(b)

ROBOT MECHANISM FOR CLEANING AND INSPECTION OF LIVE-LINE INSULATORS

CROSS-REFERENCE TO RELATED APPLICATIONS

Korean Patent No. 10-0691616 is hereby expressly incorporated herein in its entirety by reference thereto.

FIELD OF THE INVENTION

The present invention relates to a robot mechanism for cleaning and inspecting insulators provided between a power cable and a support in power transmission/distribution lines, electrified contact rails, etc., and, more particularly, to a robot mechanism that adopts a dry cleaning method to clean the surface of live-line insulators without using water and can perform cleaning and inspection of the surface of the live-line insulators while automatically moving along an insulator string.

BACKGROUND INFORMATION

Generally, a live-line insulator cleaning apparatus adopts a washing method, and some examples thereof are described in Korean Patent No. 283530, Korean Patent No. 433752, U.S. Pat. No. 5,119,851, etc. Such a conventional washing type live-line insulator cleaning apparatus has not only a low cleaning efficiency, but also requires a great amount of water, making it difficult to apply the conventional apparatus particularly to cleaning of insulators of power transmission/distribution lines that are often installed in a mountainous area. For a steel tower often installed in a town, the conventional apparatus scatters a great amount of water during cleaning operation, thus resulting in common application to civil environments.

To solve these problems of the conventional washing type apparatus, a manual live-insulator cleaning apparatus has been developed to clean insulators using a brush even with a small amount of water. However, the most important problem of this apparatus is that, in the case where an insulator string has a very long length as in a 345 kV power transmission/distribution line, it is very difficult to manipulate the apparatus since an insulating rod is significantly increased in length. Therefore, the manual live-insulator cleaning apparatus is restricted in use only to a 154 kV level or less.

To overcome these problems, it has been investigated to put a robot into use to clean live-line insulators in Japan, China, etc., from the middle of the 1980s. For example, cleaning robots for cable heads of power transmission/distribution lines are believed to have been developed in Japan, and, a robot for cleaning live-line insulators with compressed air and water is believed to have been developed by NGK Insulators, Ltd. and used by Chubu Electric Power Co., Inc., Shikoku Electric Power Co., etc. Additionally, insulator cleaning robots for 500 kV power transmission/distribution lines employing water and a brush are believed to have been developed in China, and, water spray type insulator cleaning robots is believed to have been developed in Italy.

However, the aforementioned conventional insulator cleaning robots have a common feature in that these robots use water to clean the insulators. Therefore, it is necessary to use great amounts of water for sufficient cleaning, which is not suitable for some situations where most of the power transmission/distribution lines are located in mountainous areas, and causes difficulty in application and management thereof. Further, these conventional insulator robots require a water tank to supply water thereto and a device to spray water, making it difficult to achieve weight reduction.

SUMMARY

Example embodiments of the present invention address the above-mentioned problems.

Example embodiments of the present invention provide a robot mechanism for cleaning and inspecting live-line insulators that can clean and inspect the live-line insulators with a dry cleaning method, in which a cleaning unit directly cleans the surface of each insulator with rotational brush and a circular motion guide in place of water while moving along an insulator string.

Example embodiments of the present invention provide for improvement in efficiency and safety of cleaning operation and accomplishment of weight reduction of a robot mechanism through development of a drying type insulator cleaning method that does not use water and eliminates a water tank and a washing devices to permit the robot mechanism to be suitably applied to the case where most of power transmission/distribution lines are located in mountainous areas.

Example embodiments of the present invention provide for improvement in reliability, efficiency, and convenience of operation performed usually in high terrestrial altitude and extra high voltage environment through development of a robot mechanism that includes a new dry type cleaning unit and can automatically move along an insulator string to perform cleaning and inspection of the insulators with the cleaning unit.

Example embodiments of the present invention provide for prevention of an unintentional power supply interruption through detection of defective insulators by the provision of a mechanism capable of performing cleaning and inspection operations.

According to an example embodiment of the present invention, a robot mechanism for cleaning and inspecting live-line insulators with a rotational brush while reciprocating along a insulator string of the live-line insulators includes: a main unit having upper and lower wing frames connected with each other by a connecting bracket to surround the insulator string, a cleaning unit disposed between the upper and lower wing frames and including a base frame to perform dry cleaning with a rotational brush and a circular motion (CM) guide, a lift unit including a clamp and a ball-bearing screw to move the main unit up or down, and an inspection unit to electrically inspect the insulators; and a coupling unit to couple a pair of the main units to allow the pair of main units to move along a tension insulator string or a suspension insulator string.

Further details and aspects of example embodiments of the present invention are described in more detail below with reference to the appended Figures.

DETAILED DESCRIPTION

Exemplary embodiments of the present invention are described in greater detail below with reference to the Figures.

Figure 1:
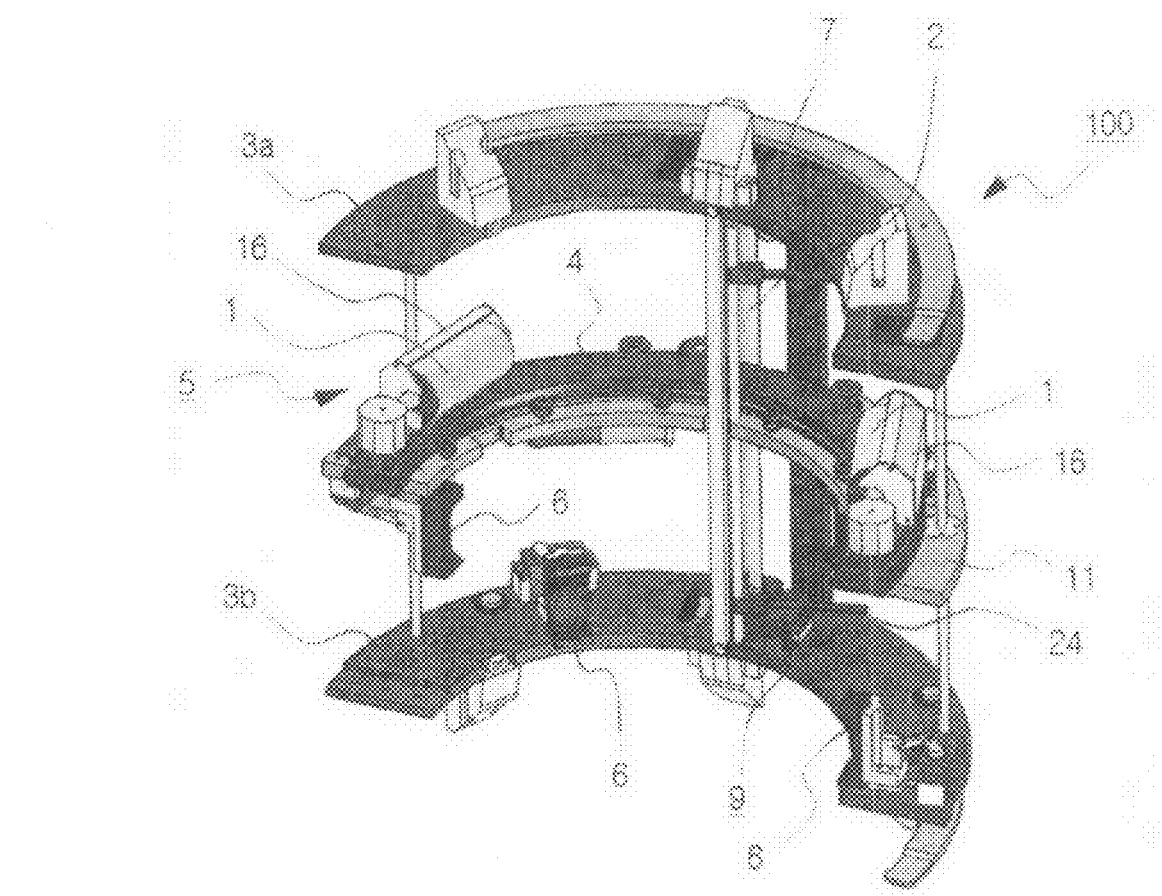
FIG. 1 is a perspective view of a wing-shaped main unit of a robot mechanism for cleaning and inspection of live-line insulators according to an example embodiment of the present invention.

FIG. 1 is a perspective view of a main unit 100 of a robot mechanism for cleaning and inspection of live-line insulators. The robot mechanism is configured to clean live-line insulators 200 with a rotational brush 1 while reciprocating along an insulator string 201 of the live-line insulators 200. The robot mechanism includes: a main unit 100 shaving upper and lower wing frames 3a and 3b connected with each other by a connecting bracket 2 to surround the insulator string 201 of the live-line insulators 200, a cleaning unit 5 disposed between the upper and lower wing frames 3a and 3b and including a base frame 11 to perform dry cleaning with at least one rotational brush 1 and a circular motion (CM) guide 4, a lift unit 8 including clamps 6 and a ball-bearing screw 7 to move the main unit 100 up or down, and an inspection unit 9 to electrically inspect the insulators 200; and a coupling unit 10 to couple a pair of the main units 100 to allow the pair of main units 100 to move along a tension insulator string 201a or a suspension insulator string 201b.

Figure 4:
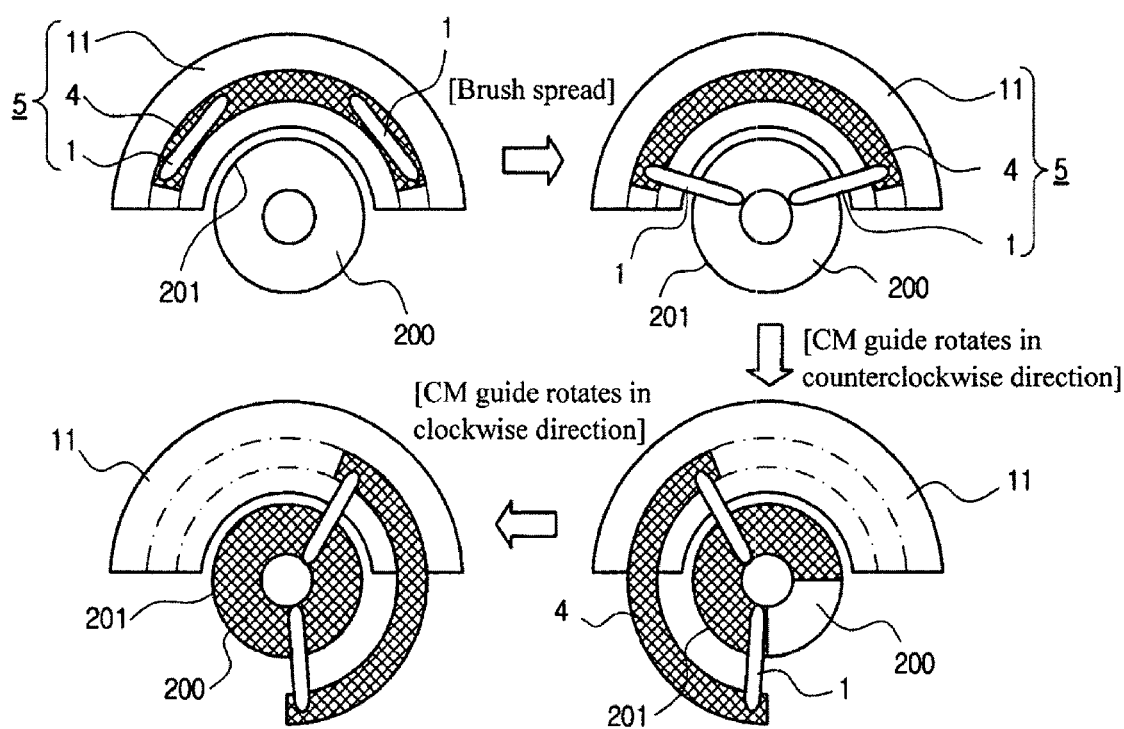
FIG. 4 is a flow diagram illustrating a cleaning method of the cleaning unit illustrated in FIG. 2.

The main unit 100 of the robot mechanism is described with reference to FIG. 1. The cleaning unit 5 is disposed between the upper and lower wing frames 3a and 3b to move up or down along the ball-bearing screw 7, and includes the base frame 11, the CM guide 4 and the rotational brush 1, both of which are mounted on the base frame 11. Referring to FIG. 4, operation of the cleaning unit 5 will be described hereinafter.

In consideration that a cleaning target surface of one of the live-line insulators has a circular shape centered on a cap of the insulator, the CM guide 4 of the cleaning unit 5 is configured to allow reciprocation of the rotational brush 1 on a porcelain plane of each live-line insulator 200. The rotational brush 1 maximizes efficiency of dry type cleaning through self-rotation added to its reciprocation. In this example embodiment, the cleaning unit 5 includes two rotational brushes 1 and the CM guide 4, which has the rotational brushes 1 mounted thereon and is supported by a guide rail or a roller on the base frame 11, to perform cleaning operation while reciprocating around the cap of the live-line insulator 200.

In other words, from FIG. 4 where a shadow section on the porcelain plane of the live-line insulator 200 indicates that cleaning has been already performed by the cleaning unit, it should be understood that, when the CM guide 4 is rotated in the counterclockwise direction and then in the clockwise direction, the surface of the live-line insulator 200 is completely cleaned.

Figure 2:
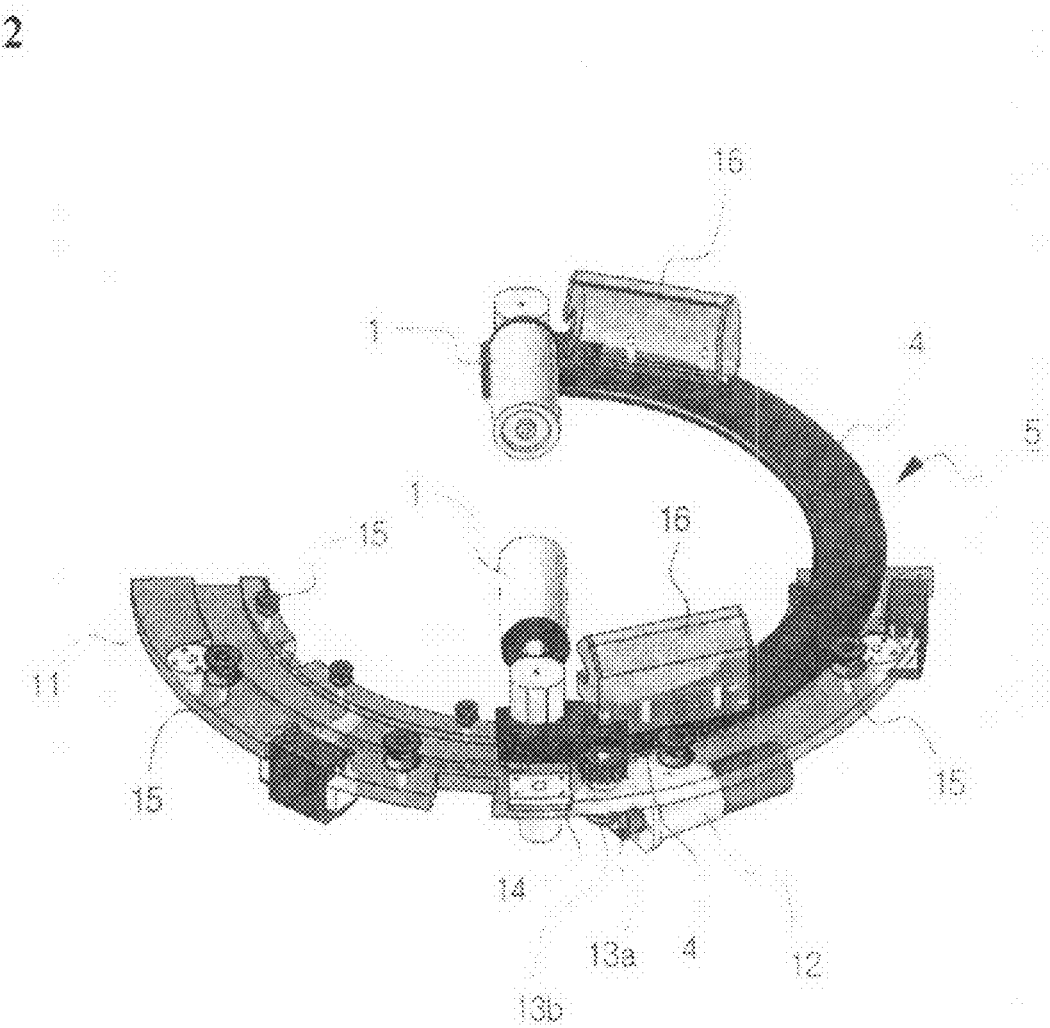
FIG. 2 is a perspective view of a cleaning unit of the robot mechanism illustrated in FIG. 1.
Figure 3:
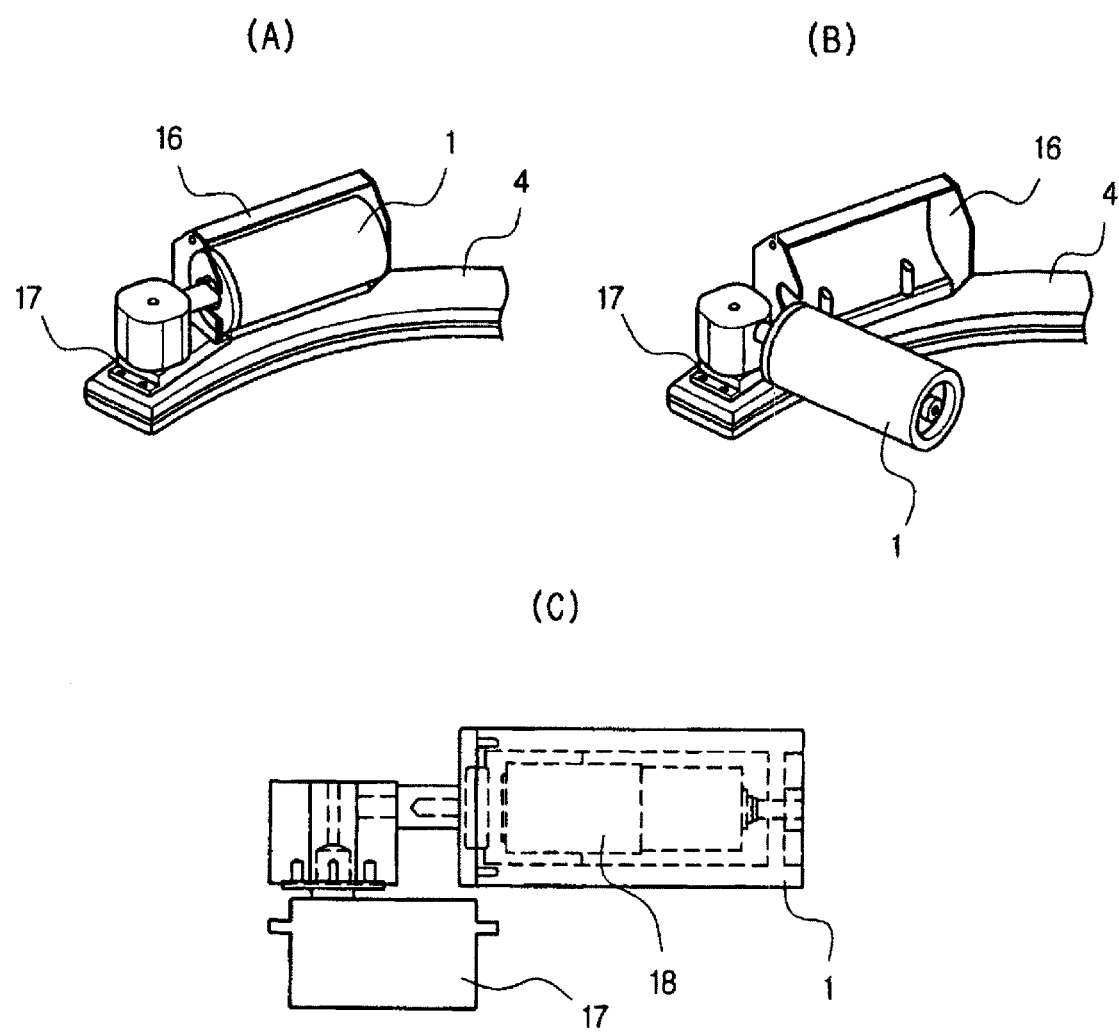
FIGS. 3(a) and 3(b) illustrate open and closed states of a rotational brush illustrated in FIG. 2.
FIG. 3(c) illustrates an inner configuration of the rotational brush.

Referring to FIGS. 2 and 3, the cleaning unit 5 includes the CM guide 4 which is driven on the base frame 11 by combination of a DC motor 12, a first bevel gear 13a, a second bevel gear 13b and a spur gear 14, guide rollers 15 to assist in movement of the CM guide 4, the two rotational brushes 1 mounted on the CM guide 4, and a brush housing 16 to accommodate each of the rotational brushes 1.

With this construction, a driving force of the DC motor 12 mounted under the base frame 11 is supplied to the CM guide 4 through the spur gear 14 engaged with the CM guide 4 via the first and second bevel gears 13a and 13b, thereby driving the CM guide 4.

Opening/closing of each rotational brush 1 is performed by an RC servo motor 17 as illustrated in FIG. 3. A small DC motor 18 is provided to the rotational brush 1 to allow self-rotation of the rotational brush 1. FIGS. 3(a) and 3(b) illustrate a closed state and an open state of the brush housing 16 of the rotational brush, respectively.

In this example embodiment, bristles of the rotational brush 1 are made from stainless steel (SUS) knitted yarns. However, the bristles of the rotational brush can be made from any other material which exhibits excellent dry cleaning capability.

Figure 5:
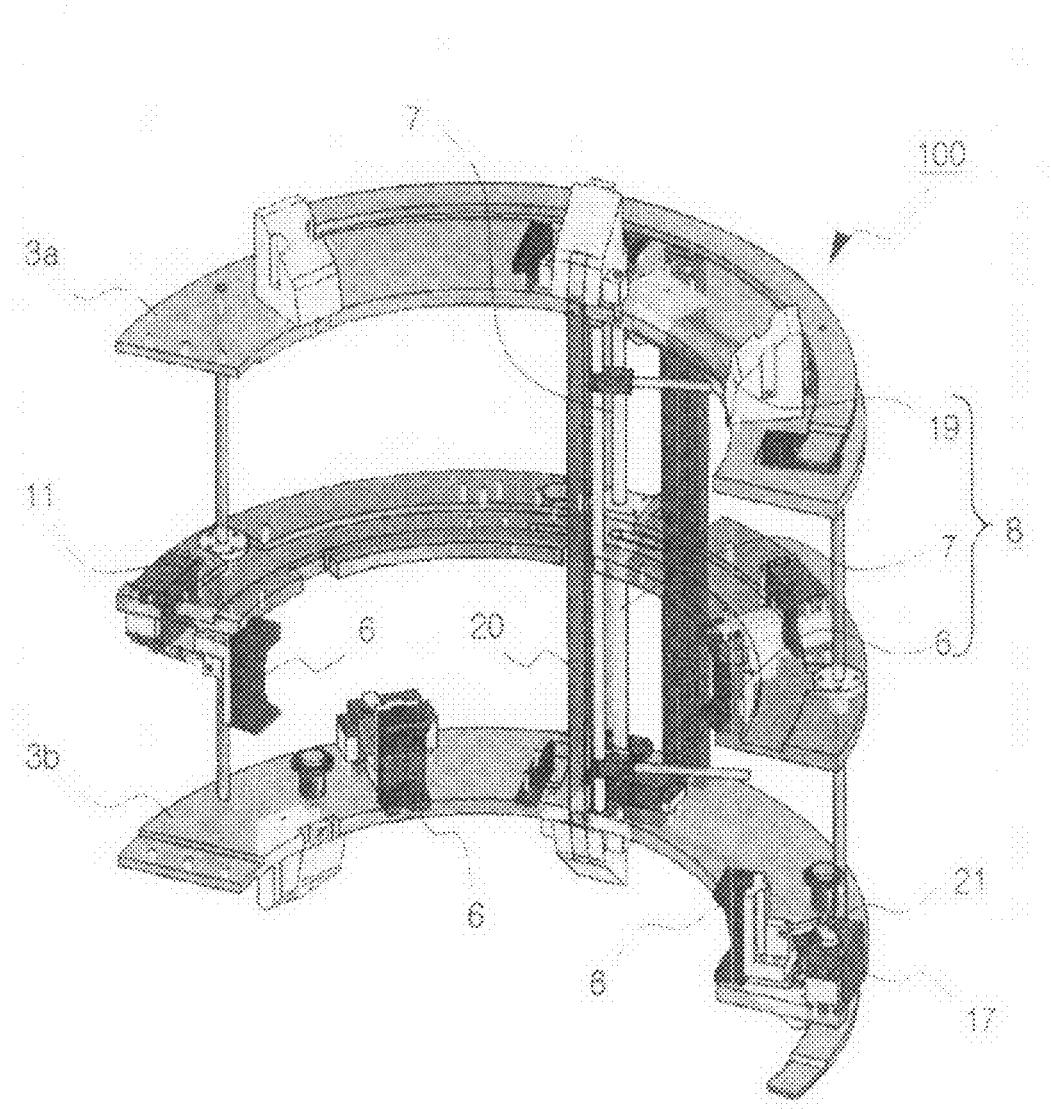
FIG. 5 is a perspective view of a lift unit of the robot mechanism illustrated in FIG. 1.

FIG. 5 is a perspective view of the lift unit 8 of the robot mechanism. The lift unit 8 is configured to allow the base frame 11 of the cleaning unit 5 to reciprocate vertically between the upper and lower wing frame 3a and 3b. The lift unit 8 includes the ball-bearing screw 7, a DC motor 19 for driving the ball-bearing screw 7, a skid bar 20, and other lifting assistant devices such as the clamps to realize vertical reciprocation.

With this structure, lifting and lowering of the cleaning unit 5 are performed while the clamp 6 mounted on the lower wing frame 3b grips a porcelain portion of the live-line insulator 200, and, lifting and lowering of the upper and lower wing frames 3a and 3b are performed while the clamp 6 mounted on the base frame 11 of the cleaning unit 5 grips the porcelain portion of the live-line insulator 200.

Figure 6:
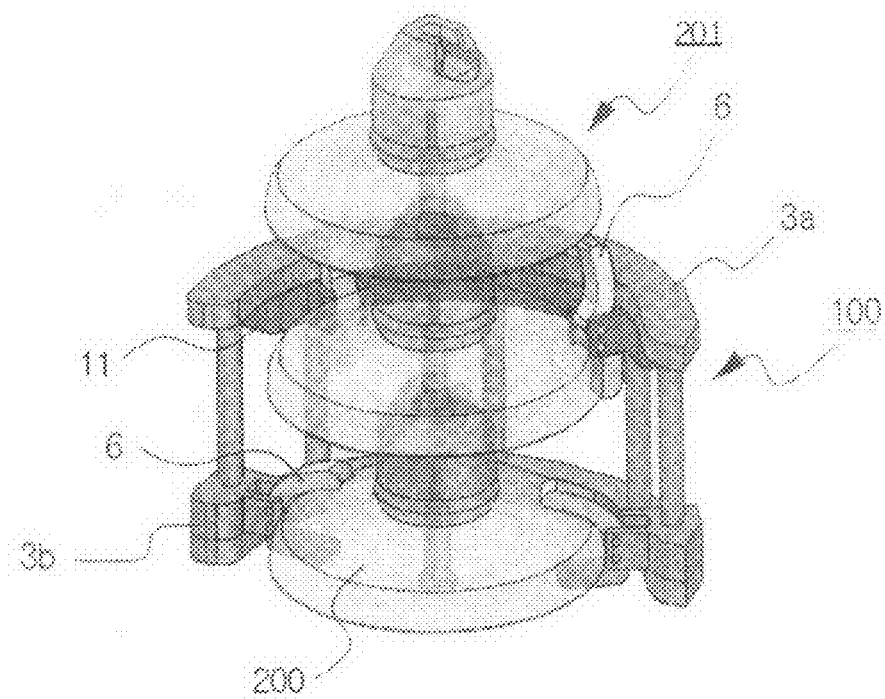
FIG. 6 is a diagrammatically perspective view showing a lift unit according to an example embodiment of the present invention.
Figure 7:
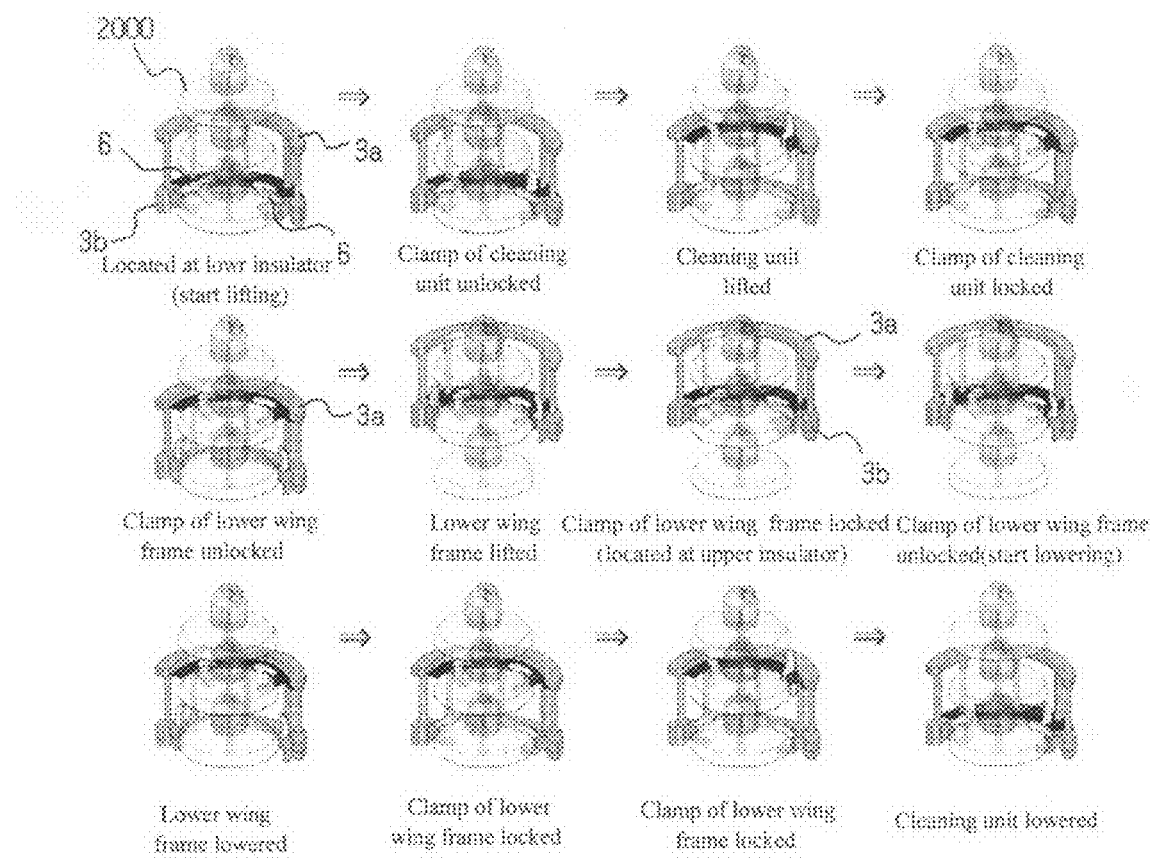
FIG. 7 is a flow diagram of operation of the lift unit illustrated in FIG. 6.

In FIG. 7, lifting and lowering of the main unit 100 by the lift unit 8 illustrated in FIG. 6 is illustrated. Specifically, referring to FIG. 7, with the porcelain portion of the live-line insulator 200 alternately gripped by the clamps 6 that are respectively mounted on the lower wing frame 3b and the base frame 11 of the cleaning unit 5, the cleaning unit 5 and the upper and lower wing frames 3a and 3b are alternately lifted or lowered along the ball-bearing screw 7, allowing the main unit 100 to be raised or lowered.

Figure 8:
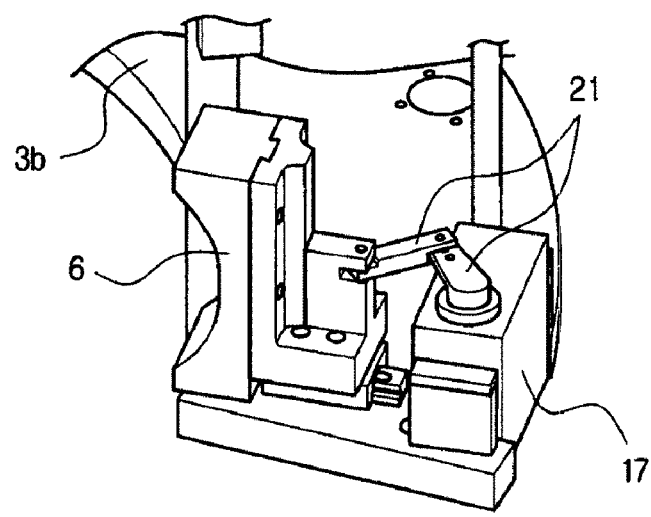
FIGS. 8(a) and 8(b) are perspective views of operating states of a clamp illustrated in FIG. 5.
Figure 8:
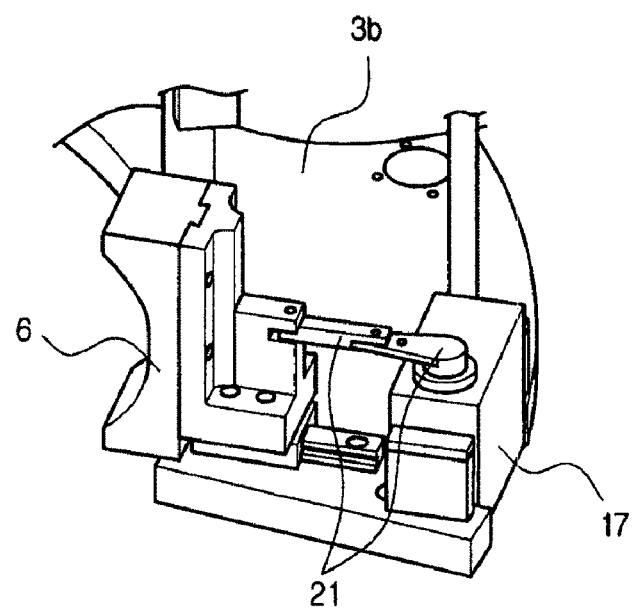

As illustrated in FIG. 8, each of the clamp 6 has a two-link structure in which two links 21 having two degrees of freedom are driven by the RC servo motor 17 and configured to be located at a singularity when the clamp 6, is completely locked to grip the porcelain portion of the live-line insulator 200, that is, upon clamping operation of the clamp 6. Further, the skid bar 20 is located inside the upper and lower wing frames 3a and 3b to allow the main unit 100 to be easily slid thereon when moving on the insulator string 201.

Figure 9:
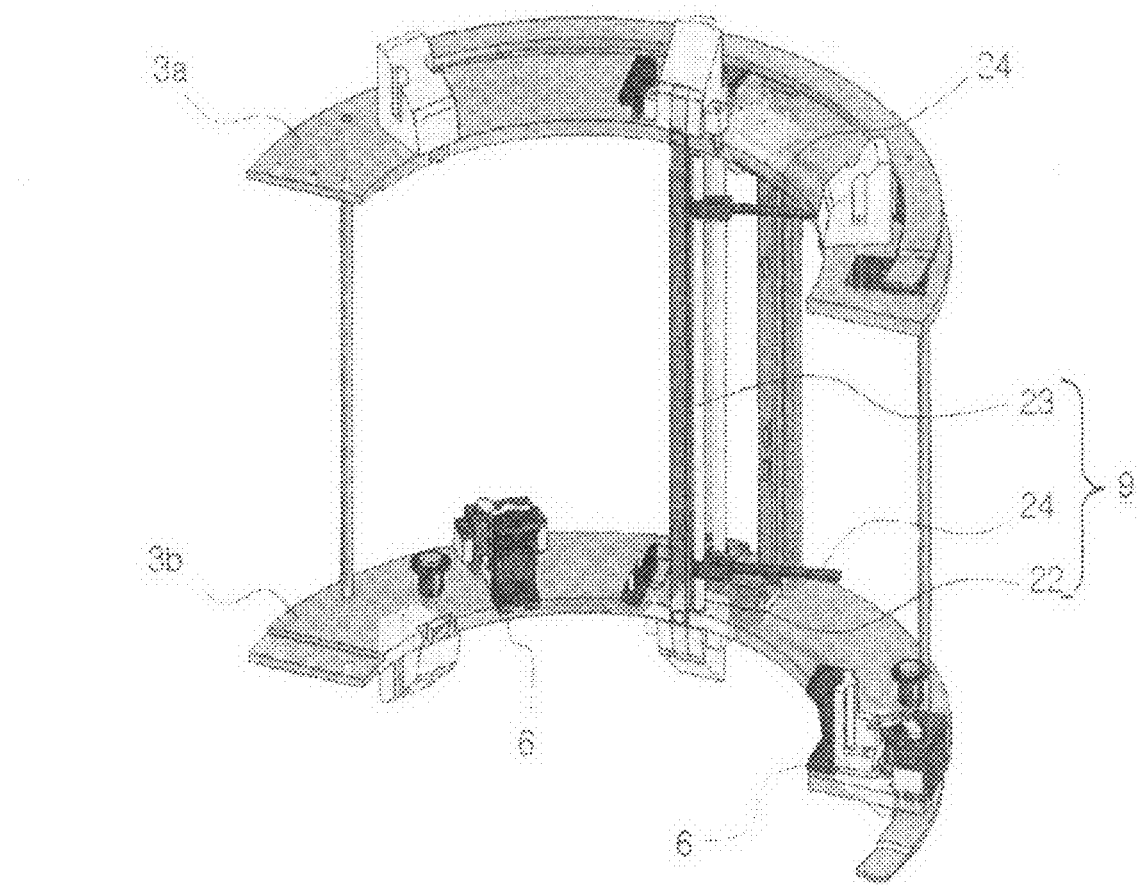
FIG. 9 is a perspective view of an inspection unit for detecting a defective insulator of the robot mechanism illustrated in FIG. 1.
Figure 10:
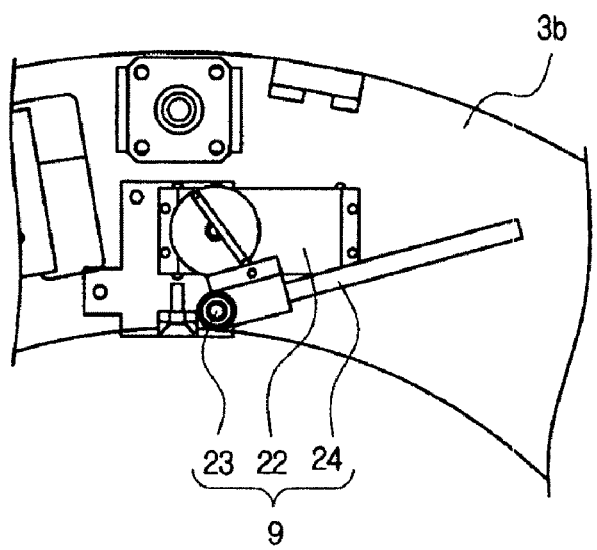
FIGS. 10(a) and 10(b) are plan views of operating states of a detection rod illustrated in FIG. 8.
Figure 10:
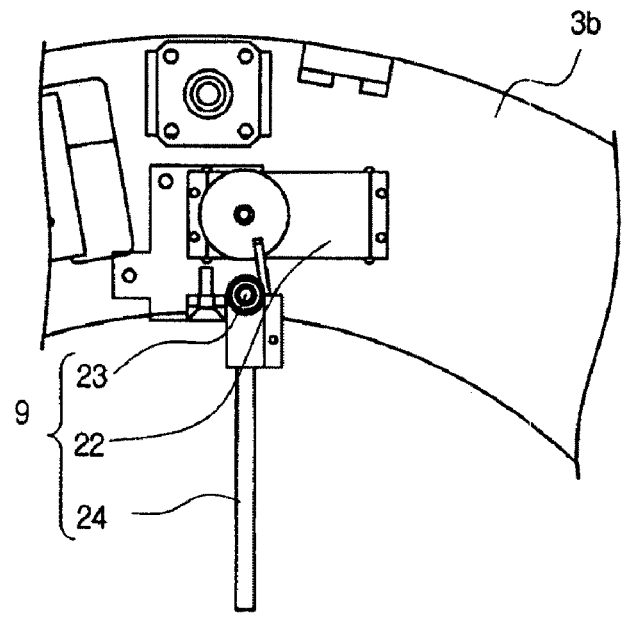
Figure 11:
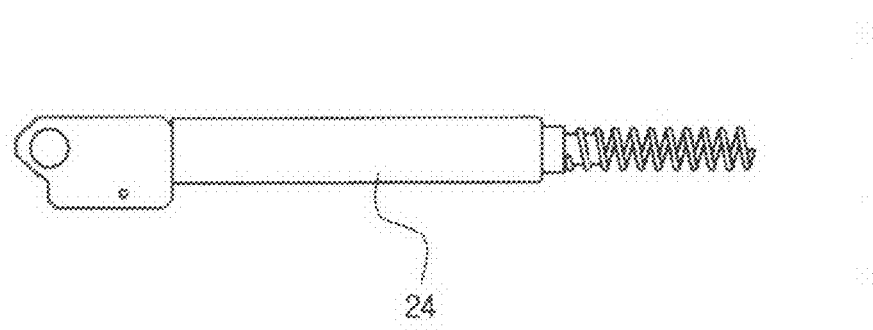
FIG. 11 is a structural view of the detection rod illustrated in FIG. 10.

FIG. 9 illustrates the inspection unit 9 of the main unit 100 for detecting a defective insulator. The inspection unit 9 includes a rotational shaft 23 driven by an RC servo motor 22, and two detection rods 24 mounted on the rotational shaft 23. In the inspection unit 9, the detection rods 24 are brought into contact with the cap of the live-line insulator 200 by rotating the rotational shaft 23 to electrically detect the live-line insulator 200. FIGS. 10 (a) and 10(b) are plan views of operating states of the detection rod 24 illustrated in FIG. 8, and FIG. 11 illustrates the configuration of the detection rod 24.

In the above description, the main unit 100 illustrated in FIG. 1 includes the upper and lower wing frames 3a and 3b, cleaning unit 5, lift unit 8, and inspection unit 9. Meanwhile, for the robot mechanism to perform a stable operation on a double series of tension insulator strings 201a or a single series of suspension insulator strings 201b, the robot mechanism is constituted by combining two main units 100 as described above into a single structure by a coupling unit 10, which will be described below.

Figure 12:
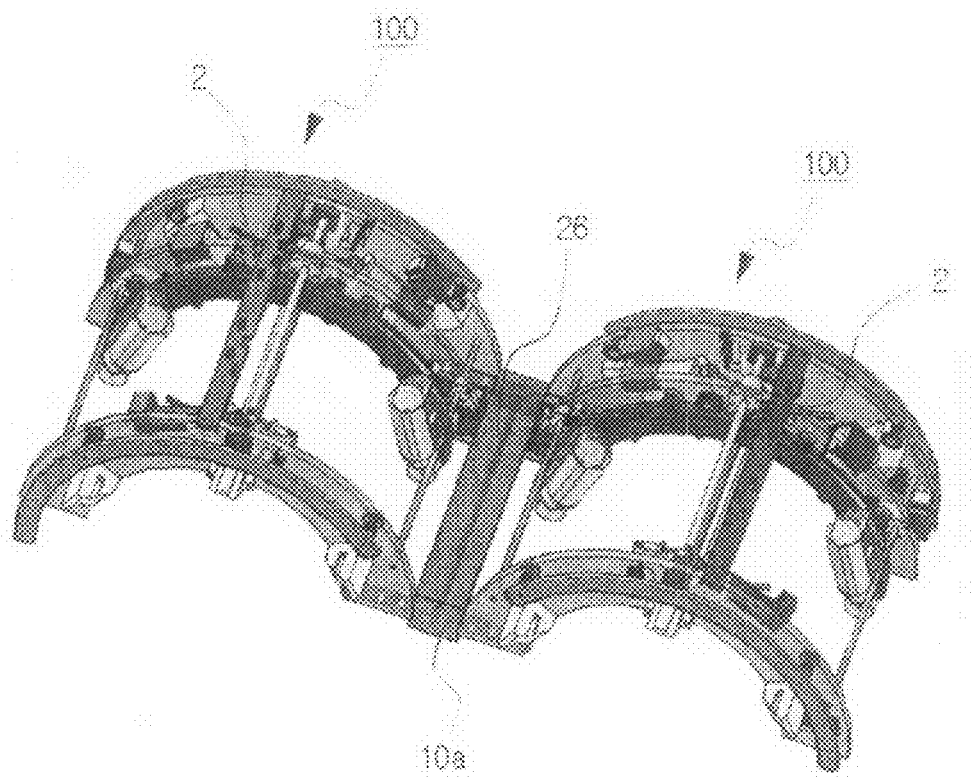
FIG. 12 is a perspective view of a robot mechanism in which a pair of main units is coupled as a robot mechanism for tension insulator strings.
Figure 13:
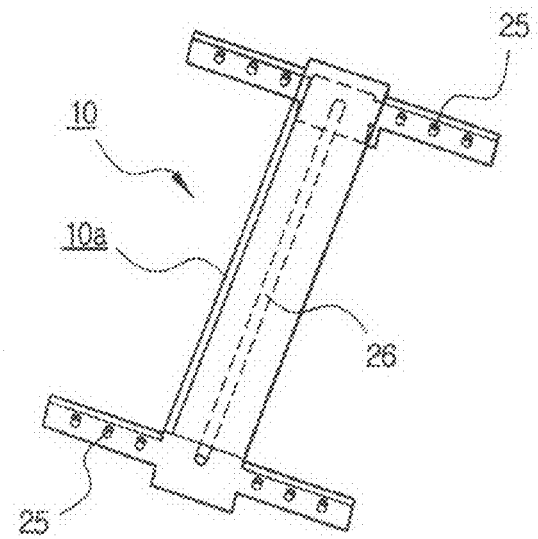
FIG. 13 is a structural view of a coupling unit for the robot mechanism illustrated in FIG. 12.

Here, the coupling unit 10 to couple the main units 100 can be classified into a coupling unit 10a for tension insulator strings 210a, as illustrated in FIGS. 12 and 13, and a coupling unit 10b for suspension insulator strings 201b depending on a kind of insulator.

Figure 14:
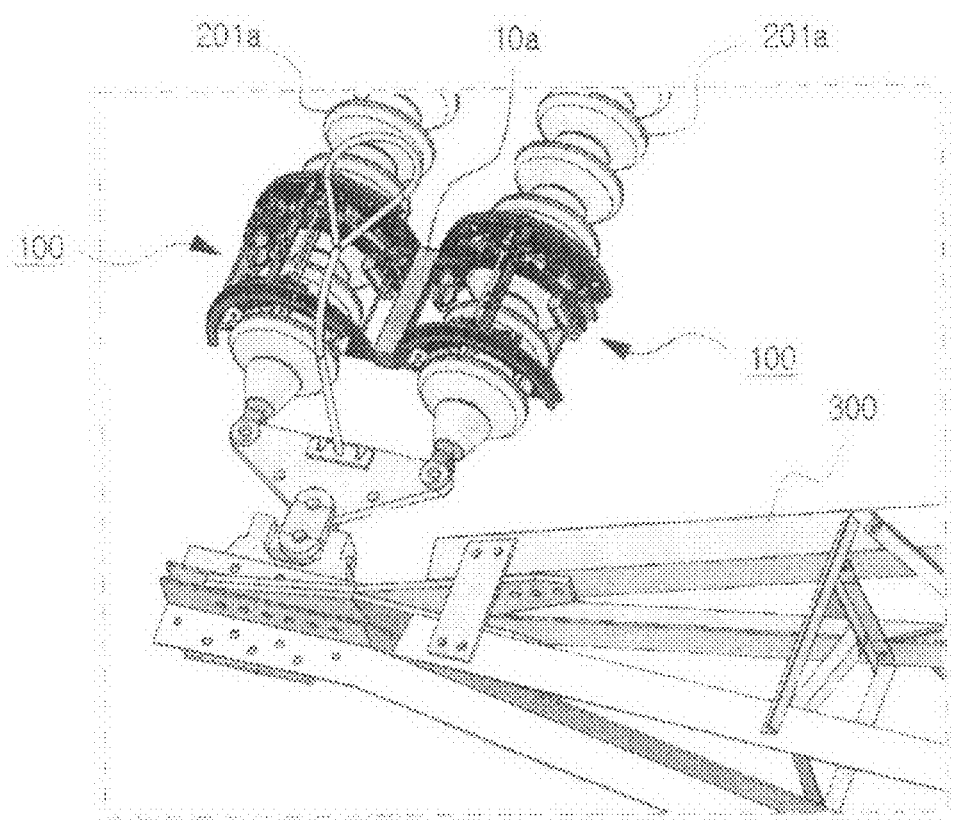
FIG. 14 is a perspective view of the robot mechanism illustrated in FIG. 12 applied to an insulator.

Since the coupling unit 10a for tension insulator strings serves only to connect the main units 100 simply in parallel due to a structural feature of the tension insulator strings 201a, which are typically arranged vertical to gravity, that is, substantially vertical to the ground, the coupling unit 10a for tension insulator strings includes an H-type bracket 26 in which bolt fastening holes 25 are formed and by which the upper and lower wing frames 3a and 3b of one main unit 100 are coupled to those of the other main unit 100 arranged in parallel to the one main unit. As illustrated in FIG. 14, the main units 100 coupled by the coupling unit 10a are used to clean and inspect the tension insulator strings 210a of a steel tower 300.

Figure 15:
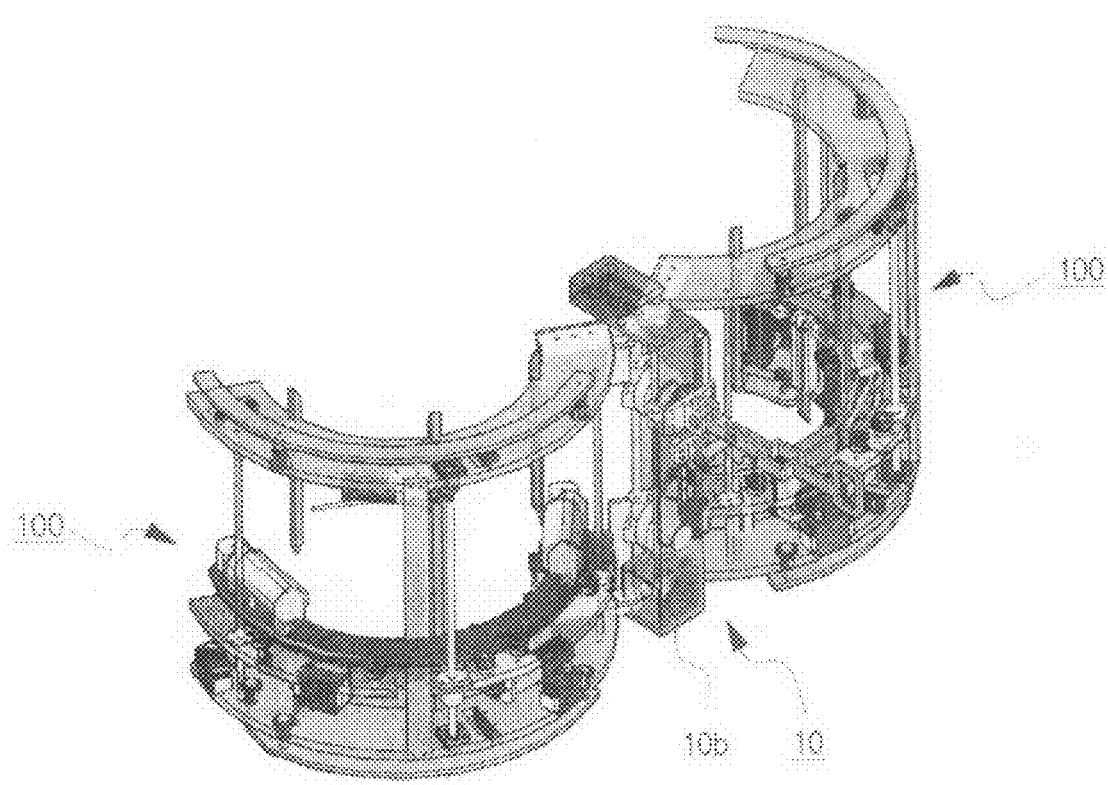
FIG. 15 is a perspective view of a robot mechanism in which a pair of main units is coupled as a robot mechanism for suspension insulator strings.

In FIG. 15, the coupling unit 10b for suspension insulator strings is illustrated. Unlike the coupling unit 10a simply connecting the main units 100 in parallel, the coupling unit 10b has a function to open or close the main units 100 such that the main units 100 can be mounted on the suspension insulator string 201b arranged in the direction of gravity. For this purpose, the coupling unit 10b for suspension insulator strings has a cam-follower structure.

Figure 16:
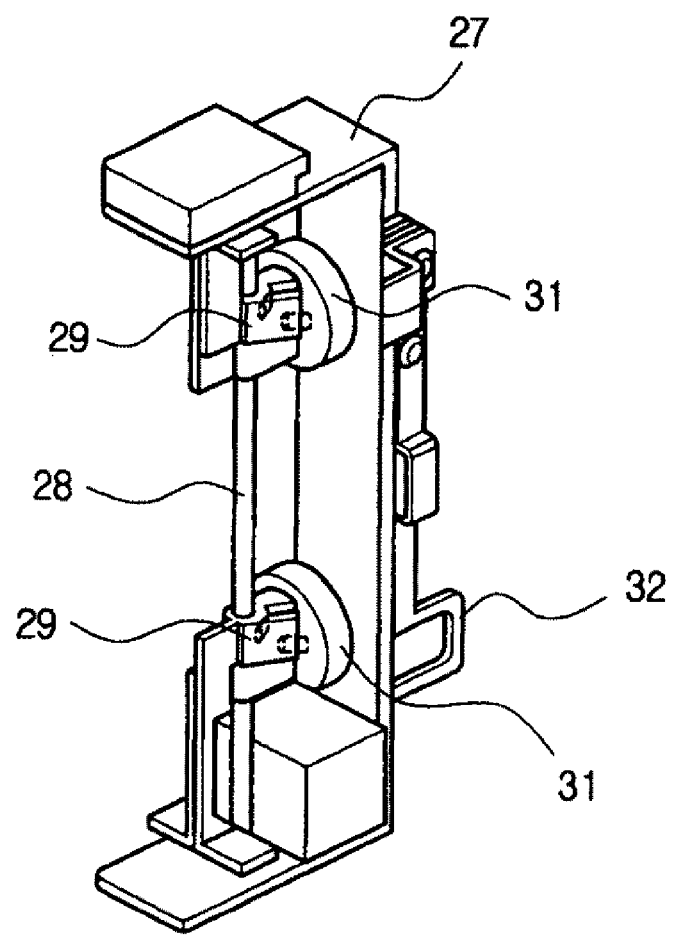
FIG. 16 is a structural view of a coupling unit for the robot mechanism illustrated in FIG. 15.
Figure 17:
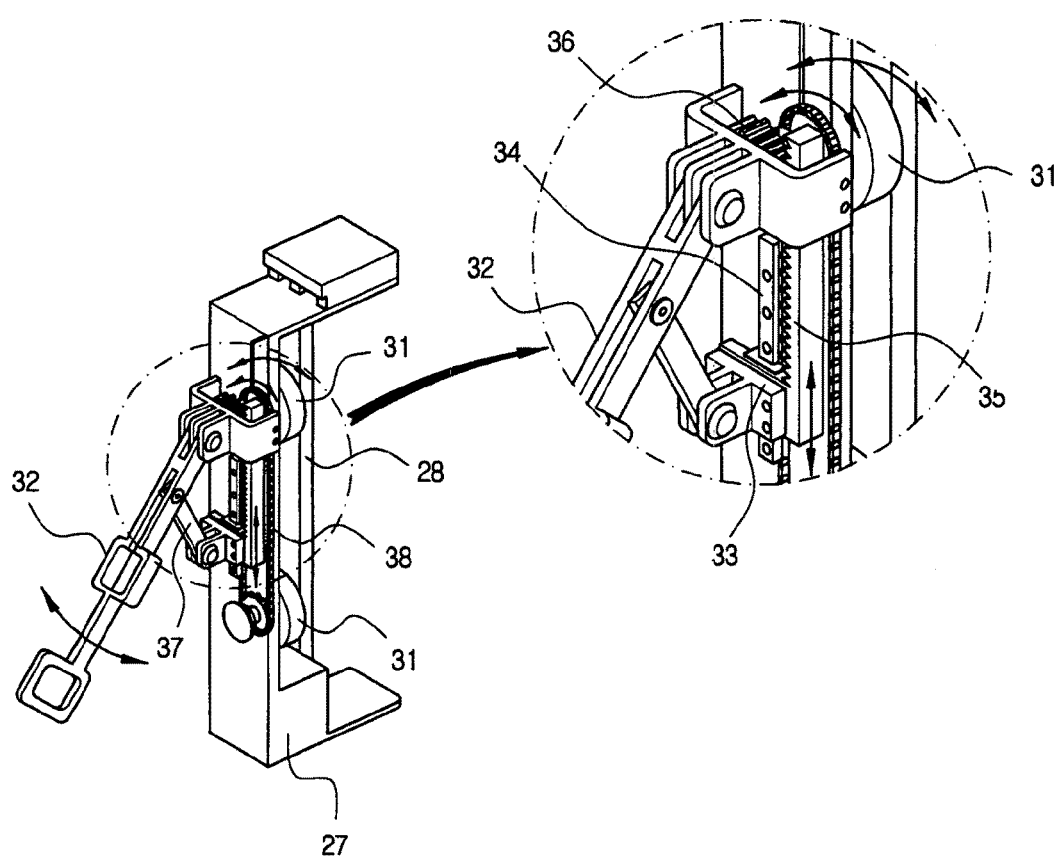
FIG. 17 is a structural view of the coupling unit viewed in an opposite direction from FIG. 16.

Specifically, as illustrated in FIGS. 16 and 17, the coupling unit 10b includes a connecting bracket 27, a linear rod 28 rotating on the connecting bracket 27, two cams 29 each being located at upper and lower ends of the linear rod 28 and having a groove formed on each cam, two cylindrical followers 31 each having two pins 30 to drive the cams 29, a lever 32 handled by an operator to rotate the followers 31, a slider 33 hingedly connected to the lever 32, an LM guide on which the slider 33 moves, and a pinion gear 36 coupled to one of the followers 31 to convert linear motion of a rack 35 mounted on the slider 33 into rotation of the followers 31.

The followers 31 are connected with each other by a chain belt 38 to rotate at the same time.

Figure 18:
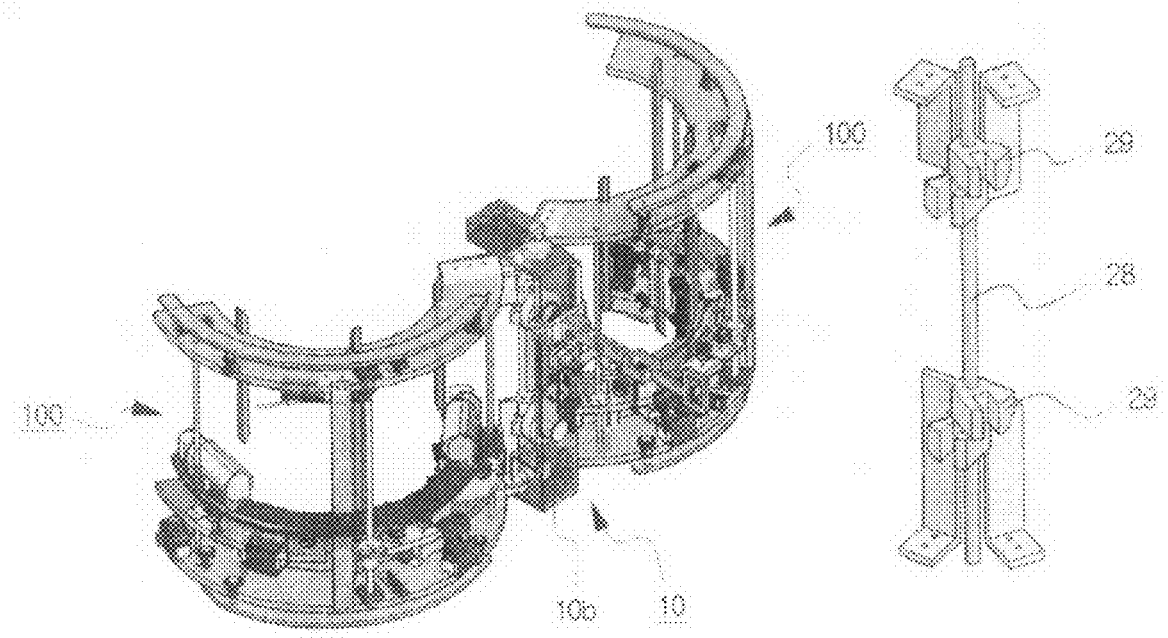
FIGS. 18 and 19 are structural views of the main units and cams illustrated in FIG. 15 in an open state and a closed state, respectively.
Figure 19:
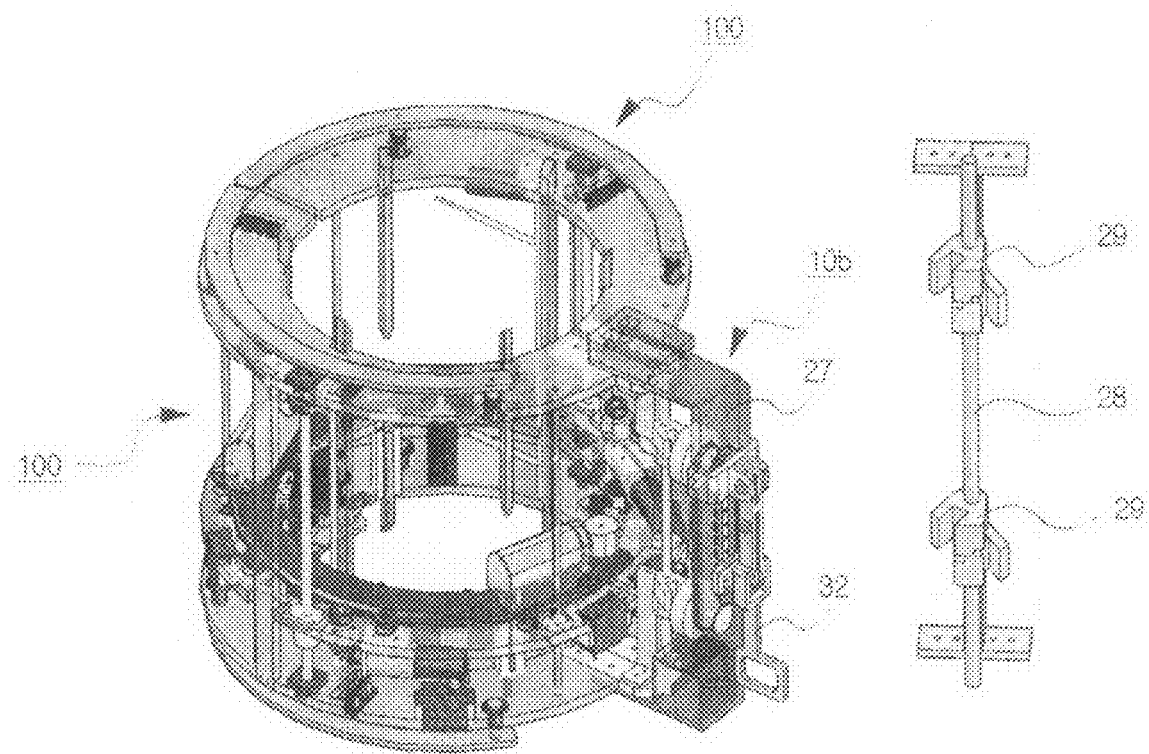
Figure 20:
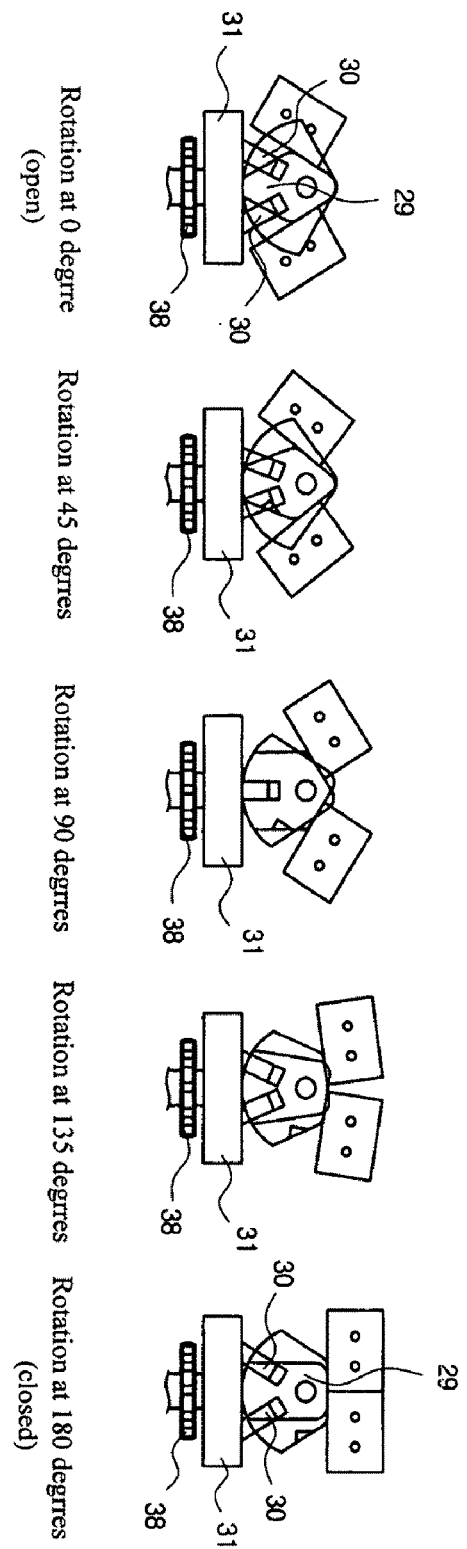
FIG. 20 are plan views of an opening/closing operation of the main units illustrated in FIG. 15.

FIGS. 18 and 19 are structural views of the main units 100 and cams 29 in an open state and a closed state, respectively, and FIG. 20 includes plan views of an opening/closing operation of the main units 100 depending on a rotational angle of the follower 31.

As illustrated in FIG. 20, the two pins 30 of the cylindrical follower 31 are moved along the linear grooves of the cams 29 by rotation of the follower 31, thereby rotating the cams 29.

Specifically, when raising the lever 32 as illustrated in FIG. 17, the slider 33 on the LM guide 34 connected with the lever 32 via a link 37 starts to make linear motion, causing the rack 35 mounted on the slider 33 to move linearly. The linear movement of the rack 35 is converted to rotation of the pinion gear 36 that is coupled to the cylindrical follower 31, so that the follower 31 is rotated and operates the cams 29 as illustrated in FIG. 20 to open or close the main units 100 as illustrated in FIGS. 18 and 19.

Figure 21:
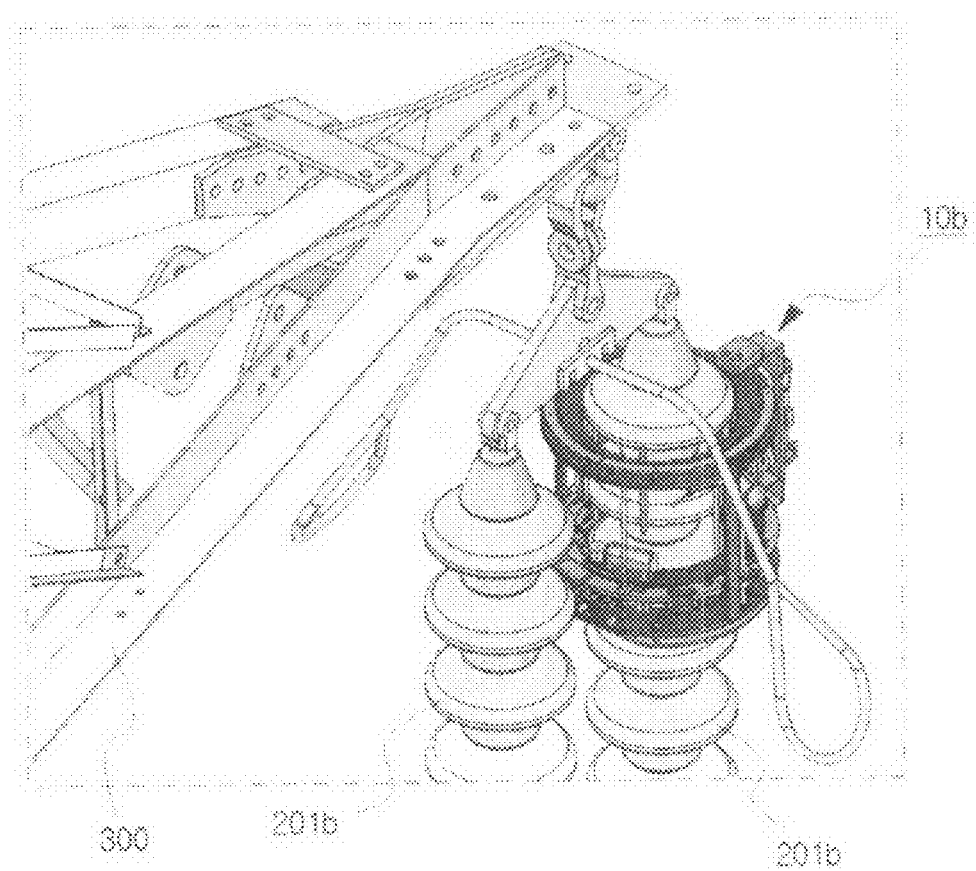
FIG. 21 is a perspective view of the robot mechanism illustrated in FIG. 15 applied to an insulator.

FIG. 21 is a perspective view of a robot mechanism that includes the main units coupled by the coupling unit 10b for suspension insulator strings and is applied to a suspension insulator string 201b of a steel tower 300.

The robot mechanism may be arranged as a robot mechanism for cleaning and inspecting live-line insulators in the dry cleaning method using the rotational brushes and the CM guide, and can be applied to various fields related to cleaning and inspection of insulators for power transmission/distribution lines, rails, etc. For example, the robot mechanism may be applied to clean and inspect insulators of 345 kV power transmission/distribution lines to show effect of the robot mechanism.

Cleaning Test

Insulator samples may be obtained by contaminating, drying and cleaning 210 kN insulators, and evaluation by an equivalent salt deposit density (ESDD) measurement method, which is under the International Electrotechnical Commission (IEC) standards and used more than any other method in the world. In this method, after attaching one of insoluble materials such as kaolin, yellow soil, etc. to the insulators in ground water, leakage current of the insulator samples depending on surrounding conditions may be measured by applying 89 kV of alternating voltage, a phase voltage of a 154 kV power transmission/distribution line, to the insulator samples. For the test, the contaminated insulator samples may be prepared by contaminating and drying the target insulators.

To obtain D level which is the highest contamination level, a first contamination mixture of 20 l of ground water, 2,000 g of culinary salt and 800 g of yellow soil, and a second contamination mixture of 20 l of ground water, 2,000 g of culinary salt and 800 g of kaolin are prepared. Then, the insulators are immersed into the contamination mixture while the mixture is stirred to maintain salt uniformity of the mixture. After immersing each insulator for 30 seconds, the insulator is taken out from the mixture, disposed to make a cap and pins of the insulator vertical to the ground to allow the mixture to uniformly cover the surface of the insulator, and dried on a rack in shadow to evaporate moisture from the insulator.

Table 1 shows contamination levels according to ESDD based on the conductivity of the insulator measured after cleaning the lower surfaces of the yellow soil and kaolin contaminated insulators with cotton. From this table, it should be appreciated that the contamination levels having been predicted depending on the amount of culinary salt coincide with results shown in Table 1.

TABLE 1

Contamination level of forcibly contaminated insulator samples

| Insoluble material 880 g | Water (l) | Culinary salt (g) | Conductivity (μs/cm) | ESDD (μg/cm²) | Contamination Level |
|---|---|---|---|---|---|
| Yellow Soil | 20 | 2,000 | 2,250 | 0.267 | D |
| Kaolin | 20 | 2,000 | 2,110 | 0.251 | D |

The insulator samples are cleaned using the robot mechanism. Each rotational brush of the robot mechanism is rotated at 2000 rpm and a CM guide is driven at 4 rpm. By cleaning the insulator samples with the robot mechanism, the yellow soil and the kaolin on the surface of the insulator samples are completely removed along with a thin film on a lateral side of each insulator sample.

Inspection Test

Figure 22:
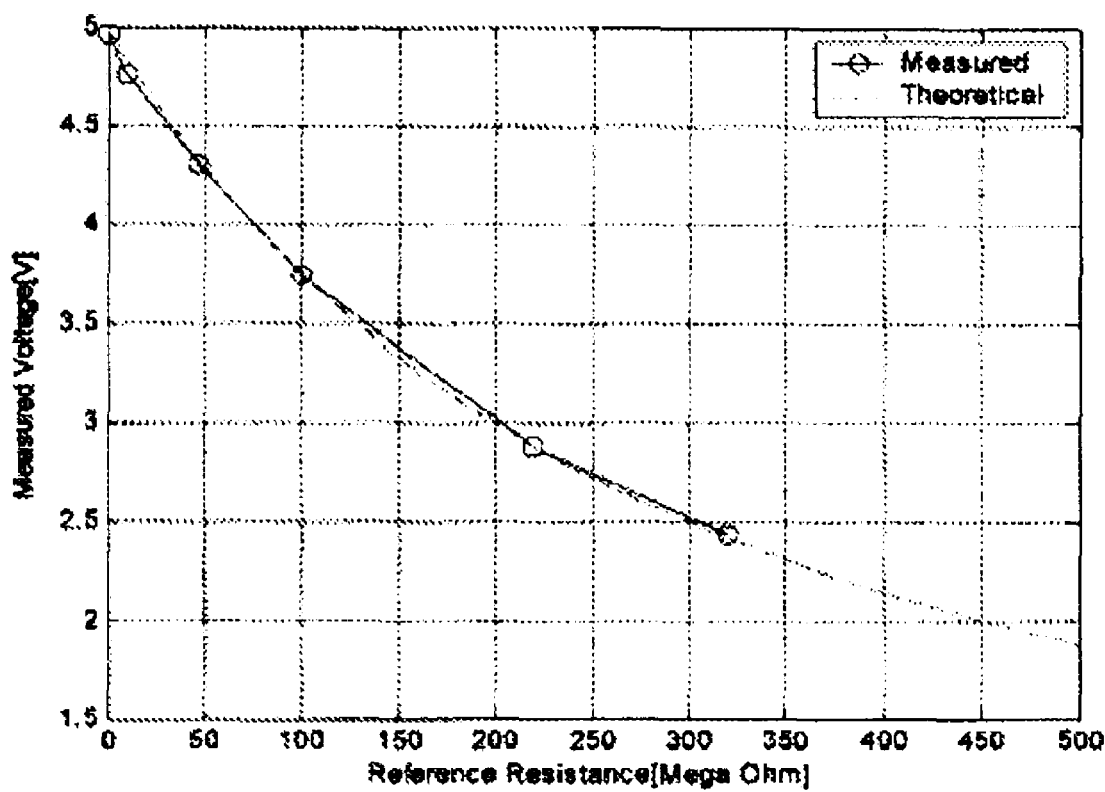
FIG. 22 is a graph of insulation resistance of insulators by the robot mechanism.

As one example of testing normal operation of the inspection unit, inspection tests are performed by connecting reference resistors of 0, 10, 47, 100, 220, and 320 MΩ between caps of two insulators in an insulator string and then measuring the resistance thereof through inspection of the insulators. Table 2 and FIG. 22 show insulation resistance of live-line insulators measured using the reference resistors. For tests of measuring the insulation resistance using the reference resistors of 0 to 320 MΩ, an average error between theoretical values and measured values is 0.006 V and a maximum error is 0.0688 V therebetween. Accordingly, it can be seen that, since the maximum error is 1.32% in the measuring range of 0~5 V, the inspection unit has very high inspection reliability. In addition, it can be seen that since a standard deviation of these errors is 0.361 V (0.722% of an overall range), the range of the errors is distributed in a very narrow region.

TABLE 2

Insulation resistance of live-line insulators

| | | Reference Resistor [MΩ] | | | | | |
|---|---|---|---|---|---|---|---|
| | | 0 | 10 | 47 | 100 | 220 | 320 |
| Voltage [V] | Theoretical Value | 5 | 4.8388 | 4.3233 | 3.7508 | 2.8856 | 2.4204 |
| | Measured Value | 4.9600 | 4.7700 | 4.3100 | 3.7460 | 2.8820 | 2.4349 |
| | Error | −.004 | 0.0688 | 0.0133 | 0.0048 | 0.003 | −0.0136 |

Notes:
Average error = 0.0060, Standard deviation = 0.0361

It should be understood that the example embodiments and the accompanying drawings as described above have been described for illustrative purposes only. Further, those skilled in the art should appreciate that various modifications, additions and substitutions are allowed without departing from the scope and spirit of the present invention.

What is claimed is:

1. A robot mechanism for cleaning live-line insulators with a rotational brush while reciprocating along an insulator string of the live-line insulators, comprising:
a main unit including upper and lower wing frames connected with each other by a connecting bracket to surround an insulator string of the live-line insulators, a cleaning unit disposed between the upper and lower wing frames and including a base frame configured to perform dry cleaning with at least one rotational brush and a CM guide, a lift unit including clamps and a ball-bearing screw configured to move the main unit up or down, and an inspection unit to electrically inspect the insulators; and
a coupling unit configured to couple a pair of the main units to allow the pair of main units to move along at least one of (a) a tension insulator string and (b) a suspension insulator string.

2. The robot mechanism according to claim 1, wherein the cleaning unit includes the CM guide driven on the base frame by combination of a DC motor, a first bevel gear, a second bevel gear and a spur gear, guide rollers configured to assist in movement of the CM guide, two rotational brushes mounted on the CM guide, and a brush housing configured to accommodate each of the rotational brushes.

3. The robot mechanism according to claim 2, wherein each of the rotational brushes includes a small DC motor for self-rotation.

4. The robot mechanism according to claim 1, wherein the lift unit includes the ball-bearing screw, a DC motor configured to drive the ball-bearing screw, a skid bar, and the clamps located on the lower wing frame and the base frame.

5. The robot mechanism according to claim 4, wherein each clamp includes a two-link structure in which two links having two degrees of freedom are configured to be driven by an RC servo motor and located at a singularity when the clamp is completely locked to grip the porcelain portion of the live-line insulator.

6. The robot mechanism according to claim 1, wherein the inspection unit includes a rotational shaft driven by an RC servo motor, and two detection rods mounted on the rotational shaft, the detection rods bringable into contact with a cap of the live-line insulator by rotating the rotational shaft to electrically detect the live-line insulator.

7. The robot mechanism according to claim 1, wherein the coupling unit to couple the main units is classified into a coupling unit for tension insulator strings and a coupling unit for suspension insulator strings.

8. The robot mechanism according to claim 7, wherein the coupling unit for tension insulator strings includes an H-type bracket in which bolt fastening holes are formed and by which the upper and lower wing frames of one main unit are coupled to those of the other main unit arranged in parallel to the one main unit.

9. The robot mechanism according to claim 7, wherein the coupling unit includes a connecting bracket, a linear rod rotatable on the connecting bracket, two cams each being located at upper and lower ends of the linear rod and having a groove formed on each cam, two cylindrical followers each having two pins configured to drive the cams, a lever handled by an operator to rotate the followers, a slider hingedly connected to the lever, an LM guide on which the slider is movable, and a pinion gear coupled to one of the followers configured to convert linear motion of a rack mounted on the slider into rotation of the followers.

10. The robot mechanism according to claim 9, wherein the followers are connected with each other by a chain belt configured to rotate at the same time.

* * * * *